United States Patent
Zhuang et al.

(10) Patent No.: US 6,887,523 B2
(45) Date of Patent: May 3, 2005

(54) METHOD FOR METAL OXIDE THIN FILM DEPOSITION VIA MOCVD

(75) Inventors: Wei-Wei Zhuang, Vancouver, WA (US); Sheng Teng Hsu, Camas, WA (US); Wei Pan, Vancouver, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 155 days.

(21) Appl. No.: 10/326,347

(22) Filed: Dec. 20, 2002

(65) Prior Publication Data

US 2004/0121074 A1 Jun. 24, 2004

(51) Int. Cl.[7] .............................................. C23C 16/40
(52) U.S. Cl. ............................ 427/255.31; 427/255.33; 427/255.35; 427/255.36
(58) Field of Search ..................... 427/255.6, 255.29, 427/255.31, 252, 255.33, 255.35, 255.36

(56) References Cited

U.S. PATENT DOCUMENTS

| | | | | |
|---|---|---|---|---|
| 5,204,313 A | * | 4/1993 | Lelental et al. ............. | 505/446 |
| 6,120,912 A | * | 9/2000 | Sawada et al. ............. | 428/470 |
| 6,204,139 B1 | | 3/2001 | Liu et al. | |
| 6,444,264 B2 | * | 9/2002 | Hintermaier et al. .. | 427/255.32 |

OTHER PUBLICATIONS

Article entitled, "Reproducible switching effect in thin oxide films for memory applications," by A. Beck et al. published in Applied Physics Letters on Jul. 3, 2000, vol. 7, No. 1 pp. 139–141.

* cited by examiner

*Primary Examiner*—Bret Chen
(74) *Attorney, Agent, or Firm*—Matthew D. Rabdau; David C. Ripma; Joseph P. Curtin

(57) ABSTRACT

An MOCVD process is provided for forming metal-containing films having the general formula $M'_xM''_{(1-x)}M_yO_z$, wherein M' is a metal selected from the group consisting of La, Ce, Pr, Nd, Pm, Sm, Y, Sc, Yb, Lu, and Gd; M" is a metal selected from the group consisting of Mg, Ca, Sr, Ba, Pb, Zn, and Cd; M is a metal selected from the group consisting of Mn, Ce, V, Fe, Co, Nb, Ta, Cr, Mo, W, Zr, Hf and Ni; x has a value from 0 to 1; y has a value of 0, 1 or 2; and z has an integer value of 1 through 7. The MOCVD process uses precursors selected from alkoxide precursors, β-diketonate precursors, and metal carbonyl precursors in combination to produce metal-containing films, including resistive memory materials.

44 Claims, 3 Drawing Sheets

METHOD FOR METAL OXIDE THIN FILM DEPOSITION VIA MOCVD

BACKGROUND OF THE INVENTION

The present invention relates to metal oxide thin films, metalorganic precursors, and metalorganic chemical vapor deposition (MOCVD), especially as related to the formation of resistive memory materials.

New materials, referred to herein as resistive memory materials, are now making it possible to produce non-volatile memory cells based on a change in resistance. Materials having a perovskite structure, among them colossal magnetoresistance (CMR) materials and high temperature superconductivity (HTSC) materials are materials that have electrical resistance characteristics that can be changed by external influences.

For instance, the properties of materials having perovskite structures, especially for CMR and HTSC materials, can be modified by applying one or more short electrical pulses to a thin film or bulk material. The electric field strength or electric current density from the pulse, or pulses, is sufficient to switch the physical state of the materials so as to modify the properties of the material. The pulse is of low enough energy so as not to destroy, or significantly damage, the material. Multiple pulses may be applied to the material to produce incremental changes in properties of the material. One of the properties that can be changed is the resistance of the material. The change may be at least partially reversible using pulses of opposite polarity, or the same polarity but with lower amplitude and wider width, from those used to induce the initial change.

SUMMARY OF THE INVENTION

An MOCVD process is provided for forming metal-containing films having the general formula $M'_xM''_{(1-x)}M_yO_z$, wherein M' is a metal selected from the group consisting of La, Ce, Pr, Nd, Pm, Sm, Y, Sc, Yb, Lu, and Gd; M'' is a metal selected from the group consisting of Mg, Ca, Sr, Ba, Pb, Zn, and Cd; M is a metal selected from the group consisting of Mn, Ce, V, Fe, Co, Nb, Ta, Cr, Mo, W, Zr, Hf and Ni; x has a value from 0 to 1; y has a value of 0, 1 or 2; and z has an integer value of 1 through 7. The MOCVD process uses precursors selected from alkoxide precursors, β-diketonate precursors, and metal carbonyl precursors in combination to produce metal-containing films, including resistive memory materials.

A substrate is placed into an MOCVD chamber and selected precursors are introduced. The precursors are selected from three general groups. The first group of precursors are alkoxides having the general formulas of $M^o(OR)_v$ or $VO(OR)_3$; where Mo is selected from the group consisting of La, Pr, Nb, Ta, W, Zr, and Hf; V is vanadium; O is oxygen; R is an alkyl, possibly selected from the consisting of $C_2H_5$, $CH(CH_3)_2$, $C(CH_3)_3$, and $CH_2CH_2CH_3$; and v is 3 or 4. The second group of possible precursors are β-diketonate precursors, for example tmhd precursors having the formula $M^o(tmhd)_u$, wherein $M^o$ is a metal selected from the group consisting of La, Ce, Pr, Nd, Pm, Sm, Y, Sc, Yb, Lu, Gd, Mg, Ca, Sr, Ba, Pb, Zn, Cd, Mn, Fe, Co, Cr, Mo, Zr, Hf, and Ni; and u is the valence of $M^o$. The third group of possible precursors are metal-carbonyls having the formula $M^o(CO)_w$, wherein $M^o$ is a metal selected from the group consisting of Ni, Fe, Cr, Co and W; C is carbon; O is oxygen; and w has an integer value of 3, 4, 5, or 6. Multiple precursors may be selected from one, or more, of these groups of precursors and introduced into the MOCVD chamber to produce the desired metal-containing films. This third group of metal carbonyls also includes precursors of the more general form $RM^o(CO)_w$, where R is an alkyl or an unsaturated monocyclic hydrocarbons, such as cyclopentadieyl or methylcyclopentadieyl.

To improve processing and delivery of these precursors, they may be dissolved in an organic hydrocarbon solvent, for example the organic hydrocarbon solvent may be selected from the group consisting of octane, THF, butyl ether, butyl acetate, tetraglymer, and iso-propanol resulting in liquid precursors.

Solid precursors may be sublimated and introduced into the MOCVD chamber using a carrier gas, or a liquid precursor may be introduced by a carrier gas after being vaporized.

DETAILED DESCRIPTION OF THE INVENTION

Figure 1:
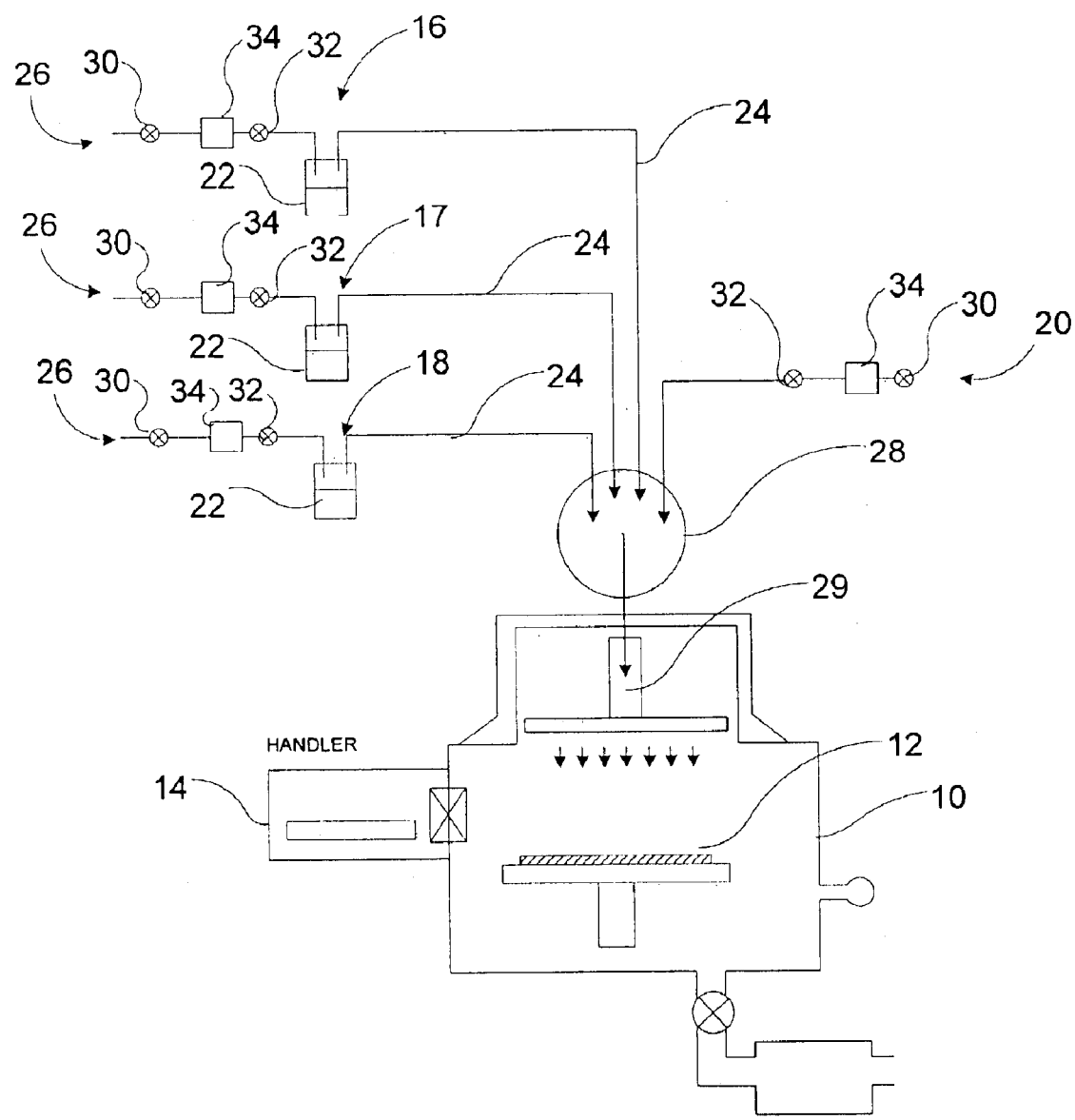
FIG. 1 is a schematic view of a CVD chamber for use with solid precursors.

A metalorganic chemical vapor deposition (MOCVD) process is used to deposit materials having resistive memory properties. Metaloxide compositions that are candidates for resistive memory material applications have the general formula of $M'_xM''_{(1-x)}M_yO_z$, in which M' is selected from La, Ce, Pr, Nd, Pm, Sm, Y, Sc, Yb, Lu, or Gd; M'' is selected from Mg, Ca, Sr, Ba, Pb, Zn or Cd; and M is selected from Mn, Ce, V, Fe, Co, Nb, Ta, Cr, Mo, W, Zr, Hf, or Ni. The value of x ranges from 0 to 1, the value of y is 0, 1 or 2, and the value of z is an integer from 1 through 7. Some of these materials are considered to be a doped $M_yO_z$ materials, so it is possible to add two dopants M' and M'' as described above. For example, $PrCaMnO_3$ (PCMO) matches this description. Alternatively, only a single material of either M' or M'' may be used, which corresponds to x being either 0 or 1. For example, $SrZrO_3$ would fit this description. A third dopant can be added from either the M' or the M'' materials. This would produce a material having a general formula of $M'_xM''_{x'}M'''_{(1-x-x')}M_yO_z$. For example, LPCMO corresponds to a PCMO material with lanthanum (La) added as an additional dopant.

To produce metaloxide materials using MOCVD, precursors are used that are preferably volatile at temperatures ranging from about 25° C. to about 230° C. at low pressures ranging from about 0.05 torr to about 10 torr. These precursors may be solid sources or liquid precursor solutions.

A first group of precursors are β-diketonates, which are formed by a metal combined with a β-diketone. The β-diketone may be, for example, 2, 2, 6, 6-tetramethyl-3,5-heptanedione, also referred to more concisely as tmhd. Examples of tmhd precursors for use in MOCVD processes for depositing resistive memory materials include precursors having the formula $M^o(tmhd)_u$, where $M^o$ is La, Ce, Pr, Nd, Pm, Sm, Y, Sc, Yb, Lu, Gd, Mg, Ca, Sr, Ba, Pb, Zn, Cd, Mn, Fe, Co, Cr, Mo, Zr, Hf, or Ni, and u equal 2, 3 or 4.

A second group of precursors are alkoxides. Among the alkoxides suitable for use in MOCVD processes for depositing resistive memory material are alkoxides that have the formula $M^o(OR)_v$, where $M^o$ is a metal, such as La, Pr, Nb, Ta, W, Zr, or Hf; O is oxygen; R is an alkyl; and v has the value of 3 or 4. The alkyl, R, may be for example $C_2H_5$, $CH(CH_3)_2$, $C(CH_3)_3$, or $CH_2CH_2CH_3$.

Alkoxides having the formula $VO(OR)_3$, may be used to introduce vanadium (V) into an MOCVD process, where O is oxygen and R is an alkyl. The alkyl, R, may be for example $C_2H_5$, $CH(CH_3)_2$, $C(CH_3)_3$, or $CH_2CH_2CH_3$.

A third group of precursors are carbonyls having the formula $M^o(CO)_w$, where $M^o$ is a metal, such as Ni, Fe, Cr, Co, or W; C is carbon; O is oxygen; and w has a value of 3, 4, 5, or 6. This third group of metal carbonyls also includes precursors of the more general form $RM^o(CO)_w$, where R is where R is an alkyl or an unsaturated monocyclic hydrocarbons, such as cyclopentadieyl or methylcyclopentadieyl. For example, $Mn(C_5H_5)(CO)_3$ or $Mn(CH_3C_5H_4)(CO)_3$ are carbonyls that may be used to provide manganese.

The precursors discussed above for MOCVD processes may be used in solid or liquid form. It is possible to dissolve either solid or liquid precursors to produce a liquid precursor having more desirable properties. For example, the precursors described above can be dissolved in hydrocarbon solvents. The preferred organic hydrocarbon solvents will not react with the precursor being dissolved; will provide high solubility of the precursor being dissolved; and will keep the precursor solution stable for a reasonable amount of time. Although, the above properties are preferred, it may be possible to produce a suitable precursor that does not have all, or any, of the preferred properties described above. Examples of suitable hydrocarbon solvents include octane, THF, butyl ether, butyl acetate, tetraglymer and isopropanol.

FIG. 1 shows a schematic illustration of a CVD chamber 10 for performing an MOCVD process. A substrate 12 is placed within the CVD chamber 10. The substrate 12 may be introduced into the chamber 10 through a handler 14. Solid precursor sources 16, 17 and 18, and a gas source 20 are shown schematically. Each solid precursor source provides one element for the desired reaction. For example, $Mn(tmhd)_3$, $Pr(tmhd)_3$, and $Ca(tmhd)_2$, with the addition of oxygen as the gas source 20, may be used to produce PCMO.

The solid precursor is placed in a heated ampule 22 and delivery lines 24 are heated to cause sublimation of the solid precursor into a precursor gas, which is then delivered into a premixing chamber 28 by a carrier gas 26. Suitable carrier gases include nitrogen, and argon. A gas valve 30 may be used to control the flow of the carrier gas into the ampule. A second valve 32 may be used to control the flow of the carrier gas and precursor into the chamber 10. In addition, a mass flow controller (MFC) 34 may be used to further regulate the flow into the chamber 10. The precursor gases produced from the solid precursors along with any additional gases are mixed in the premixing chamber 28, and then introduced into the chamber 10, possibly through a showerhead, or a gas distributor 29.

Figure 2:
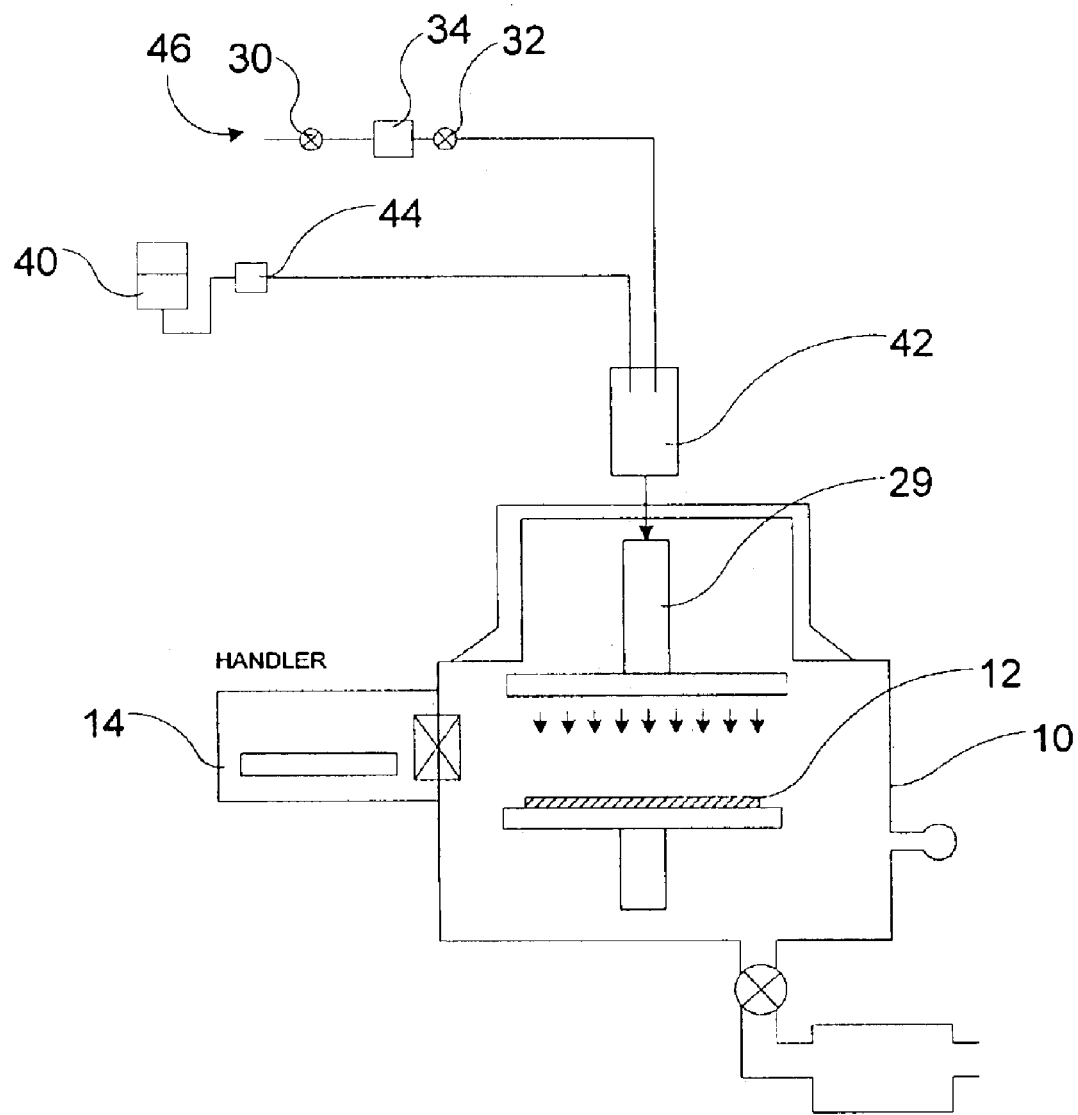
FIG. 2 is a schematic view of a CVD chamber for use with liquid precursors.

FIG. 2 shows a schematic illustration of the CVD chamber 10 for performing an MOCVD process using a liquid precursor 40. The substrate 12 is placed within the CVD chamber 10. The substrate 12 may be introduced into the chamber 10 through the handler 14. The liquid precursor 40 is produced by dissolving other precursors, for example the solid precursors described above, in an organic hydrocarbon solvent. The liquid precursor 40 will be injected into a vaporizer 42 by a micro-pump 44. The liquid precursor will be vaporized to a gas state in the vaporizer and delivered into the chamber 10 by a carrier gas 46, which may also act as a reactant gas, and be at least partially incorporated into the resulting film. As described above, the gas valve 30 may be used to control the flow of the carrier gas into the vaporizer. The second valve 32 may be used to further control the flow of the carrier gas into the chamber 10. In addition, the mass flow controller 34 may be used to further regulate the flow into the camber 10, possibly through a showerhead, or a gas distributor 29.

In the case of either solid precursor or liquid precursor based processes. Additional gases may also be introduced. The additional gases may include oxygen, nitrous oxide, or other gases to be reacted during the MOCVD process, or buffer gases, such as nitrogen or argon, that aid in regulating the pressure within the chamber, or are otherwise desirable, but are not incorporated into the deposited material. Although, some of the precursors described above include oxygen, which may be incorporated into the final metal-containing film, it may be desirable to provide oxygen from a separate source to supplement oxygen already present in the precursors or to provide oxygen in the case of precursors that do not include oxygen.

Figure 3:
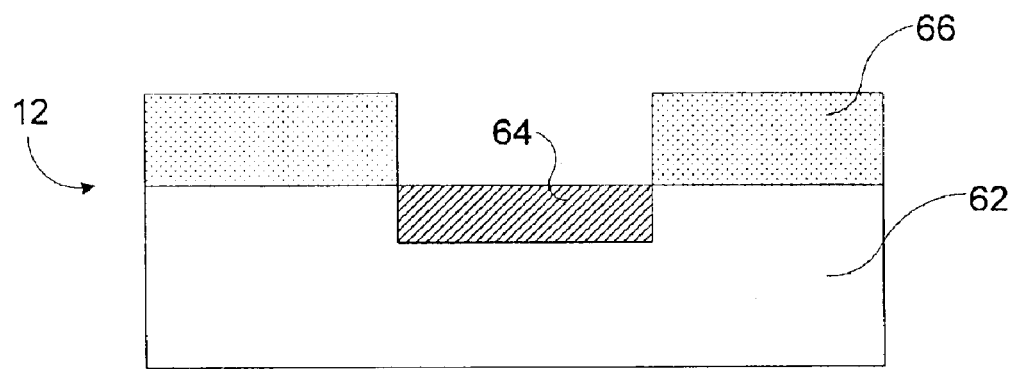
FIG. 3 is a cross-sectional view of a semiconductor structure.

FIG. 3 shows the substrate 12 prior to MOCVD processing. The substrate 12, as shown comprises a substrate material 62 that has been patterned to produce a bottom electrode 64. An insulating layer 66 has been deposited and patterned to open a contact to the bottom electrode 64. The substrate material 62 may be silicon, without or without another overlying material or oxide, for example YBCO. The bottom electrode 64 is preferably Pt, Ir, $IrO_2$, or $RuO_2$, or other material that is a suitable bottom electrode for resistive memory applications. Some of these materials have been identified as providing for epitaxial or pseudo-epitaxial crystal growth for resistive memory materials. Although, the substrate 12 has been shown comprising additional structures, it remains possible and within the scope of this process to use MOCVD to deposit resistive memory material onto a suitable flat substrate 12, with or without a bottom electrode.

Figure 4:
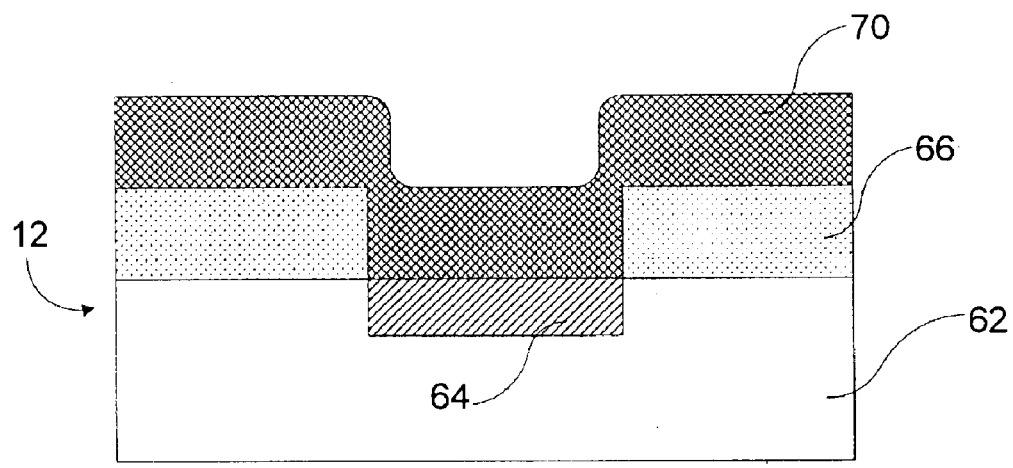
FIG. 4 is a cross-sectional view of a semiconductor structure following MOCVD processing.

FIG. 4 shows the substrate 12 following processing in the MOCVD chamber. A layer of metal containing film 70 has been formed overlying the insulating layer 66 and the bottom electrode 64. Alternatively, the metal containing film 70 could have been formed over the substrate material 62, without any insulating layer or bottom electrode. The metal containing film 70 is formed by introducing the substrate 12 into the MOCVD chamber as discussed above and exposing the substrate to desired precursors. In the case of the present process, which is intended to from metal containing films generally, and resistive memory materials preferably, the substrate 12 is exposed to a combination of precursors from one or more of the classes of precursors described above, such as β-diketonates, alkoxides, or metal carbonyls, along with oxygen to form a layer of metal containing film having the general formula $$M'_xM''_{(1-x)}M_yO_z.$$

The following examples are given to illustrate some of the possible embodiments that can be obtained from the present invention.

EXAMPLE 1

This exemplary MOCVD process produces a PCMO film on a substrate. The substrate is placed in an MOCVD chamber. A liquid precursor is produced by dissolving solid precursors of $Mn(tmhd)_3$, $Pr(tmhd)_3$, and $Ca(tmhd)_2$, in a mixed solvent of butyl ether and tetraglymer. This liquid precursor is injected into a vaporizer and introduced into the MOCVD chamber. Oxygen is also introduced into the MOCVD chamber, where the precursors and oxygen react to form a PCMO film on the surface of the substrate.

EXAMPLE 2

This exemplary MOCVD process produces a lathanum-calcium manganese oxide (LCMO) film on a substrate. The substrate is placed in an MOCVD chamber. A liquid precursor is produced by dissolving solid precursors of $Mn(tmhd)_3$, $La(tmhd)_3$, and $Ca(tmhd)_2$, in a mixed solvent of butyl ether and tetraglymer. This liquid precursor is injected into a vaporizer and introduced into the MOCVD chamber. Oxygen is also introduced into the MOCVD chamber, where the precursors and oxygen react to form a LCMO film on the surface of the substrate.

EXAMPLE 3

This exemplary MOCVD process produces a PCMO film on a substrate. The substrate is placed in an MOCVD chamber. A liquid precursor is produced by dissolving solid precursors of $Mn(tmhd)_3$, $Pr(OCH(CH_3)_2)_3$, and $Ca(tmhd)_2$, in a mixed solvent of butyl ether and tetraglymer. This liquid precursor is injected into a vaporizer and introduced into the MOCVD chamber. Oxygen is also introduced into the MOCVD chamber, where the precursors and oxygen react to form a PCMO film on the surface of the substrate.

EXAMPLE 4

This exemplary MOCVD process produces a PCMO film on a substrate. The substrate is placed in an MOCVD chamber. A liquid precursor is produced by dissolving solid precursors of $Mn(CH_3C_5H_4)(CO)_3$, $Pr(tmhd)_3$, and $Ca(tmhd)_2$, in a mixed solvent of butyl ether and tetraglymer. This liquid precursor is injected into a vaporizer and introduced into the MOCVD chamber. Oxygen is also introduced into the MOCVD chamber, where the precursors and oxygen react to form a PCMO film on the surface of the substrate.

EXAMPLE 5

This exemplary MOCVD process produces a PCMO film on a substrate. The substrate is placed in an MOCVD chamber. A liquid precursor is produced by dissolving solid precursors of $Mn(C_5H_5)(CO)_3$, $Pr(OCH(CH_3)_2)_3$, and $Ca(tmhd)_2$, in a mixed solvent of butyl ether and tetraglymer. This liquid precursor is injected into a vaporizer and introduced into the MOCVD chamber. Oxygen is also introduced into the MOCVD chamber, where the precursors and oxygen react to form a PCMO film on the surface of the substrate.

While the present invention has been particularly shown and described with respect to exemplary and preferred embodiments, it will be understood that the changes in form and detail may be made without departing from the scope of the present invention. The present invention should not be limited to any exemplary or preferred embodiment, but rather should be limited only by the claims.

What is claimed is:

1. An MOCVD process comprising:
   a) providing a substrate within an MOCVD reactor;
   b) introducing an alkoxide precursor into the MOCVD reactor containing the substrate;
   c) introducing a second metal-containing precursor into the MOCVD reactor containing the substrate; and
   d) forming a metal-containing film overlying the substrate; wherein the metal-containing film has the formula $M'_x M''_{(1-x)} M_y O_z$, wherein M' is a metal selected from the group consisting of La, Ce, Pr, Nd,.Pm, Sm, Y, Sc, Yb, Lu, and Gd; M" is a metal selected from the group consisting of Mg, Ca, Sr, Ba, Pb, Zn, and Cd; M is a metal selected from the group consisting of Mn; Ce, V, Fe, Co, Nb, Ta, Cr, Mo, W, Zr, Hf and Ni; x has a value from 0 to 1; y has a value of 0, 1 or 2; and z has an integer value of 1 through 7.

2. The MOCVD process of claim 1, wherein the alkoxide precursor has the formula $M^o(OR)_v$, wherein $M^o$ is selected from the group consisting of La, Pr, Nb, Ta, W, Zr, and Hf; O is oxygen; R is an alkyl; and v is 3 or 4.

3. The MOCVD process of claim 2, wherein the alkyl is selected from the group consisting of $C_2H_5$, $CH(CH_3)_2$, $C(CH_3)_3$, and $CH_2CH_2CH_5$.

4. The MOCVD process of claim 3, wherein the alkoxide precursor is dissolved in an organic hydrocarbon solvent prior to being introduced into a reactor containing the substrate.

5. The MOCVD process of claim 4, wherein the organic hydrocarbon solvent is selected from the group consisting of octane, THF, butyl ether, butyl acetate, tetraglymer, and iso-propanol.

6. The MOCVD process of claim 1, wherein the alkoxide precursor has the formula $VO(OR)_3$, wherein V is vanadium; O is oxygen; and R is an alkyl.

7. The MOCVD process of claim 6, wherein the alkyl is selected from the group consisting of $C_2H_5$, $CH(CH_3)_2$, $C(CH_3)_3$, and $CH_2CH_2CH_3$.

8. The MOCVD process of claim 7, wherein the alkoxide precursor is dissolved in an organic hydrocarbon solvent prior to being introduced into a reactor containing the substrate.

9. The MOCVD process of claim 8, wherein the organic hydrocarbon solvent is selected from the group consisting of octane, THF, butyl ether, butyl acetate, tetraglymer, and iso-propanol.

10. The MOCVD process of claim 1, wherein the second metal containing precursor is a metal-beta diketone precursor.

11. The MOCVD process of claim 10 wherein the metal-beta diketone precursor has the formula $M^o(tmhd)_u$ wherein $M^o$ is a metal selected from the group consisting of La, Ce, Pr, Nd, Pm, Sm, Y, Sc, Yb, Lu, Gd, Mg, Ca, Sr, Ba, Pb, Zn, Cd, Mn, Fe, Co, Cr, Mo, Zr, Hf, and Ni; and u is the valence of $M^o$.

12. The MOCVD process of claim 11, wherein u is 2, 3, or 4.

13. The MOCVD process of claim 12, wherein the metal-beta diketone precursor is dissolved in an organic hydrocarbon solvent prior to being introduced into a reactor containing the substrate.

14. The MOCVD process of claim 13, wherein the organic hydrocarbon solvent is selected from the group consisting of octane, THF, butyl ether, butyl acetate, tetraglymer, and iso-propanol.

15. The MOCVD process of claim 1, wherein the second metal containing precursor is a metal-carbonyl precursor.

16. The MOCVD process of claim 15, wherein the metal-carbonyl precursor has the formula $M^o(CO)_w$, wherein $M^o$ is a metal selected from the group consisting of Ni, Fe, Cr, Co and W; C is carbon; O is oxygen; and w has an integer value of 3, 4, 5, or 6.

17. The MOCVD process of claim 16, wherein the metal-carbonyl precursor is dissolved in an organic hydrocarbon solvent prior to being introduced into a reactor containing the substrate.

18. The MOCVD process of claim 17 wherein the organic hydrocarbon solvent is selected from the group consisting of octane, THF, butyl ether, butyl acetate, tetraglymer, and iso-propanol.

19. The MOCVD process of claim 1, wherein introducing the alkoxide precursor and introducing the second metal-containing precursor is accomplished by dissolving the alkoxide precursor and the second metal-containing precursor in a solvent to produce a single liquid precursor and introducing the single liquid precursor into the MOCVD reactor.

20. The MOCVD process of claim 1, wherein introducing the metal-carbonyl precursor and introducing the second metal-containing precursor is accomplished by dissolving the metal-carbonyl precursor and the second metal-containing precursor in a solvent to produce a single liquid precursor and introducing the single liquid precursor into the reactor.

21. The MOCVD process of claim 1, wherein introducing the metal-beta diketone precursor and introducing the second metal-containing precursor is accomplished by dissolving the metal-beta diketone precursor and the second metal-containing precursor in a solvent to produce a single liquid precursor and introducing the single liquid precursor into the reactor.

22. An MOCVD process comprising:
  a) providing a substrate within an MOCVD reactor;
  b) introducing a metal-carbonyl precursor into the MOCVD reactor containing the substrate;
  c) introducing a second metal-containing precursor into the MOCVD reactor containing the substrate; and
  d) forming a metal-containing film overlaying the substrate;
  wherein the metal-containing film has the formula $M'_xM''_{(1-x)}M_yO_z$, wherein M' is a metal selected from the group consisting of La, Ce, Pr, Nd, Pm, Sm, Y, Sc, Yb, Lu, and Gd; M" is a metal selected from the group consisting of Mg, Ca, Sr, Ba, Pb, Zn, and Cd; M is a metal selected from the group consisting of Mn, Ce, V. Fe, Go, Nb, Ta, Cr, Mo, W, Zr, Hf, and Ni; x has a value from 0 to 1; y has a value of 0, 1, or 2; and z has an integer value of 1 through 7.

23. The MOCVD process of claim 22, wherein the metal-carbonyl precursor is dissolved in an organic hydrocarbon solvent prior to being introduced into a reactor containing the substrate.

24. The MOCVD process of claim 23, wherein the organic hydrocarbon solvent is selected from the group consisting of octane, THF, butyl ether, butyl acetate, tetraglymer, and iso-propanol.

25. The MOCVD process of claim 22, wherein the second metal containing precursor is a metal-beta diketone precursor.

26. The MOCVD process of claim 25, wherein the metal-beta diketone precursor has the formula $M^o(tmhd)_u$ wherein $M^o$ is a metal selected from the group consisting of La, Ce, Pr, Nd, Pm, Sm, Y, Sc, Yb, Lu, Gd, Mg, Ca, Sr, Ba, Pb, Zn, Cd, Mn, Fe, Co, Cr, Mo, Zr, Hf and Ni; and u is the valence of $M^o$.

27. The MOCVD process of claim 26, wherein u is 2, 3, or 4.

28. The MOCVD process of claim 26, wherein the metal-beta diketone precursor is. dissolved. in an organic hydrocarbon solvent prior to being introduced into a reactor containing the substrate.

29. The MOCVD process of claim 28, wherein the organic hydrocarbon solvent is selected from the group consisting of octane, THF, butyl ether, butyl acetate, tetraglymer, and iso-propanol.

30. The MOCVD process of claim 27, wherein the metal-carbonyl containing precursor has the formula $M^o(CO)_w$, wherein $M^o$ is a metal selected from the group consisting of Ni, Fe, Cr, Co and W; C is carbon; O is oxygen; and w has an integer value of 3, 4, 5, or 6.

31. An MOCVD process for forming a metal-containing film, having a formula $M'_xM''_{(1-x)}M_yO_z$, wherein M' is a metal selected from the group consisting of La, Ce, Pr, Nd, Pm, Sm, Y, Sc, Yb, Lu, and Gd; M" is a metal selected from the group consisting of Mg, Ca, Sr, Ba, Pb, Zn; Cd; M is a metal selected from the group consisting of Mn, Ce, V, Fe, Co, Nb, Ta, Cr, Mo, W, Zr, Hf and Ni; x has a value between 0 and 1; y has a value of 0, 1 or 2; and z has an integer value of 1 through 7, on a substrate comprising:
  a) introducing a metal-beta diketone precursor having the formula $M^o(tmhd)_u$, wherein $M^o$ is a metal selected from the group consisting of La, Ce, Pr, Nd, Pm, Sm, Y, Sc, Yb, Lu, Gd, Mg, Ca, Sr, Ba, Pb, Zn, Cd, Mn, Fe, Co, Cr, Mo, Zr, Hf, and Ni; and u has a value of 2, 3 or 4 into an MOCVD chamber containing the substrate;
  b) introducing a second metal-containing precursor into a reactor containing the substrate, wherein the second metal containing precursor is an alkoxide precursor or a metal-carbonyl precursor into the MOCVD chamber containing the substrate; and
  c) introducing oxygen into the MOCVD chamber containing the substrate.

32. The MOCVD process of claim 31, wherein the alkoxide precursor has the formula $M^o(OR)_v$, wherein $M^o$ is a metal selected from the group consisting of La, Pr, Nb, Ta, W, Zr, and Hf; and R is an alkyl.

33. The MOCVD process of claim 32, wherein the alkyl is selected from the group consisting of $C_2H_5$, $CH(CH_3)_2$, $C(CH_3)_3$, and $CH_2CH_2CH_3$.

34. The MOCVD process of claim 31, wherein the alkoxide precursor has the formula $VO(OR)_3$ wherein R is an alkyl.

35. The MOCVD process of claim 34, wherein the alkyl is selected from the group consisting of $C_2H_5$, $CH(CH_3)_2$, $C(CH_3)_3$, and $CH_2CH_2CH_3$.

36. The MOCVD process of claim 31, wherein the metal-carbonyl precursor has the formula $M^o(CO)_w$, wherein $M^o$ is a metal selected from the group consisting of Ni, Fe, Cr, Co and W; C is carbon; O is oxygen; and w has an integer value of 3, 4, 5, or 6.

37. The MOCVD process of claim 31, wherein the metal-beta diketone precursor is dissolved in an organic hydrocarbon solvent, selected from the group consisting of octane, THF, butyl ether, butyl acetate, tetraglymer, and iso-propanol, prior to being introduced into a reactor containing the substrate.

38. The MOCVD process of claim 31, wherein the alkoxide precursor is dissolved in an organic hydrocarbon solvent, selected from the group consisting of octane, THF, butyl ether, butyl acetate, tetraglymer, and iso-propanol, prior to being introduced into a reactor containing the substrate.

39. The MOCVD process of claim 31, wherein the metal-carbonyl precursor is dissolved in an organic hydrocarbon solvent, selected from the group consisting of octane, THF, butyl ether, butyl acetate, tetraglymer, and iso-propanol, prior to being introduced into a reactor containing the substrate.

40. The MOCVD process of claim 31, further comprising forming a bottom electrode on the substrate prior to introducing any precursor, wherein the bottom electrode is Pt, Ir, $IrO_2$ or $RuO_2$.

41. The MOCVD process of claim 31, further comprising introducing a separate oxygen source into the MOCVD chamber containing the substrate.

42. The MOCVD process of claim 31, the metal-beta diketone precursor is $Mn(tmhd)_3$, the second metal-containing precursor is an alkoxide precursor comprising $Pr(OCH(CH_3)_2)_3$, and further comprising a second metal-beta diketone precursor $Ca(tmhd)_2$, whereby the metal containing fun that is formed is PCMO.

43. The MOCVD process of claim 31, the metal-beta diketone precursor is $Pr(tmhd)_3$, the second metal-containing precursor is a metal_carbonyl precursor comprising $Mn(CH_3C_5H_4)(CO)s$, and further comprising a second metal-beta diketone precursor $Ca(tmhd)_2$, whereby the metal containing film that is formed is PCMO.

44. The MOCVD process of claim 31, the metal-beta precursor is $Ca(tmhd)_2$, the second metal-containing precursor is a metal_carbonyl precursor comprising $Mn(C_5H_5)(CO)_3$, and further comprising a third precursor that is an alkoxide precursor comprising $Pr(OCH(CH_3)_2)_3$, whereby the metal containing film that is formed is PCMO.

* * * * *